United States Patent
Shin

(10) Patent No.: US 7,704,818 B2
(45) Date of Patent: Apr. 27, 2010

(54) SEMICONDUCTOR DEVICE AND METHOD FOR MANUFACTURING SEMICONDUCTOR DEVICE

(75) Inventor: Eun Jong Shin, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/204,720

(22) Filed: Sep. 4, 2008

(65) Prior Publication Data

US 2009/0057775 A1    Mar. 5, 2009

(30) Foreign Application Priority Data

Sep. 4, 2007    (KR) .................. 10-2007-0089445

(51) Int. Cl.
*H01L 21/8238* (2006.01)
(52) U.S. Cl. .................. 438/199; 438/197; 438/207; 438/217; 438/257; 438/286; 257/301; 257/317; 257/347; 257/371; 257/E21.546
(58) Field of Classification Search ................. 257/255; 438/184, 230, 276
See application file for complete search history.

(56) References Cited

U.S. PATENT DOCUMENTS

| | | | | |
|---|---|---|---|---|
| 5,926,722 A | * | 7/1999 | Jang et al. .................. | 438/424 |
| 5,960,276 A | * | 9/1999 | Liaw et al. .................. | 438/224 |
| 6,005,279 A | * | 12/1999 | Luning ....................... | 257/510 |
| 6,010,948 A | * | 1/2000 | Yu et al. ..................... | 438/436 |
| 6,897,118 B1 | * | 5/2005 | Poon et al. .................. | 438/303 |
| 2004/0102017 A1 | * | 5/2004 | Chang et al. ................ | 438/424 |

* cited by examiner

*Primary Examiner*—N Drew Richards
*Assistant Examiner*—Kyoung Lee
(74) *Attorney, Agent, or Firm*—The Law Offices of Andrew D. Fortney; Andrew D. Fortney; William K. Nelson

(57) ABSTRACT

A method for manufacturing a semiconductor device, including etching exposed areas of a substrate using patterned nitride and insulating layers as an etch mask to form a trench in the substrate; forming a buffer layer in the trench; forming a stress-inducing layer by implanting ions into a region of the substrate around the trench using the patterned nitride and insulating layers as an ion implant mask; forming a device isolation region by filling the trench with an trench insulating layer; and removing the patterned nitride and insulating layers.

20 Claims, 4 Drawing Sheets

US 7,704,818 B2

SEMICONDUCTOR DEVICE AND METHOD FOR MANUFACTURING SEMICONDUCTOR DEVICE

CROSS-REFERENCE TO RELATED APPLICATIONS

The present application claims the benefit of priority under 35 U.S.C. §119 to Korean Patent Application No. 10-2007-0089445, filed on Sep. 4, 2007, the entire contents of which are incorporated herein by reference.

BACKGROUND

Embodiments of the invention relate to a semiconductor device and a method for manufacturing semiconductor device.

As the process technology for microfabrication of semiconductor devices has been rapidly developed, a technique of isolating a device region from other regions of a wafer is considered as one of the most important techniques. A so-called local oxidation of silicon (LOCOS) technique for forming device isolation layers by selectively growing a thick oxidation layer on a substrate is widely used as a device isolation technique.

The LOCOS technique has a significant disadvantage in that the width of a device isolation region cannot be reduced to below a certain level due to lateral diffusion of a device isolation region (e.g., lateral oxide growth) and formation of a bird's beak. Therefore, alternative techniques such as trench formation and shallow trench isolation (STI) techniques have been recently used.

A device isolation region formed by the STI technique includes an oxide layer for amending or repairing damaged silicon at an etched surface of the trench. However, since the oxide layer has a single-layer structure, a situation where leakage current increases due to high-speed operation of an active device in an active region of the substrate cannot be flexibly handled. This deteriorates the isolating and/or insulating ability of the device isolation region and may make it difficult to increase electron mobility in the device formed in the active region.

SUMMARY

Embodiments of the invention provide a semiconductor device configured to improve isolating and/or insulating ability of a device isolation region and carrier mobility in a channel region, and a method for manufacturing the semiconductor device.

In one embodiment, a semiconductor device may comprise a substrate having a device isolation region; an ion implantation region (and/or a stress-inducing layer) in the substrate around (and/or adjacent to and/or under) the device isolation region; a P-well and an N-well in regions of the substrate at least partially separated by the device isolation region; a gate electrode on the substrate away from the device isolation region; and lightly doped drain (LDD) regions in active regions defined by the device isolation region and the gate electrode, wherein the lightly doped drain region in the N-well may further comprise a stress-inducing ion.

In another embodiment, there is provided a method for manufacturing a semiconductor device, comprising: etching exposed portions of the substrate using patterned nitride and insulating layers as an etch mask to form a trench in the substrate; forming a buffer layer on a surface of the trench; forming a stress-inducing layer by implanting ions into a region of the substrate around the trench using the patterned nitride and insulating layers as an ion implant mask; forming a device isolation region by filling the trench with a trench insulating layer; and removing the patterned nitride and insulating layers.

The details of one or more embodiments are set forth in the accompanying drawings and the description below. Other features will be apparent from the description and drawings, and from the claims.

DETAILED DESCRIPTION OF THE EMBODIMENTS

A semiconductor device and a method for manufacturing a semiconductor device will now be described in detail according to embodiments of the invention. In the following description, the semiconductor device and the manufacturing method will be explained together for convenience of explanation.

Figure 1:
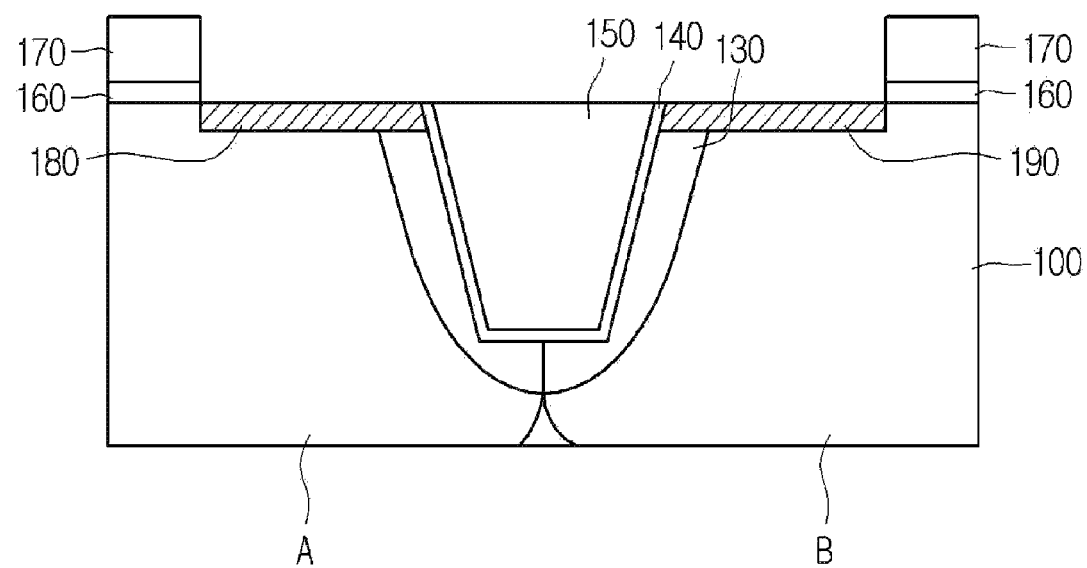
FIG. 1 is a cross-sectional view illustrating an exemplary semiconductor device in which lightly doped drain (LDD) regions are formed according to an embodiment of the invention.

FIG. 1 is a cross-sectional view illustrating an exemplary structure of a semiconductor device according to various embodiments, in which lightly doped drain (LDD) regions 180 and 190 are shown.

The semiconductor device of FIG. 1 may further include structures (not shown) such as a spacer, a source region, a drain region, a source electrode, and a drain electrode. However, since those structures are not particularly critical to understanding the present disclosure, structures existing when the LDD regions 180 and 190 are formed are illustrated.

Referring to FIG. 1, an exemplary semiconductor device includes a substrate 100, a device isolation region 150, a buffer layer 140 disposed on etched surfaces of the device isolation region 150, a stress-inducing ion implantation layer 130 formed in a portion of the substrate 100 around the device isolation region 150, a gate insulating layer 160, a gate electrode 170, an LDD region 190 formed in an N-well region (B) as a p-channel metal oxide semiconductor (PMOS) LDD region, and an LDD region 180 formed in a P-well region (A) as an n-channel metal oxide semiconductor (NMOS) LDD region. The stress-inducing layer 130 in the substrate 100 may alternatively or additionally be considered to be adjacent to and/or below the device isolation region 150. The ions that form the stress-inducing layer 130 may include ions that are larger, but functionally equivalent to, silicon. Such ions may include Ge ions, a combination of Ga and As ions, possibly Sn ions, combinations thereof, etc.

A method for manufacturing an exemplary semiconductor device such as the semiconductor device shown in FIG. 1 will now be described according to embodiments of the invention.

Figure 2:
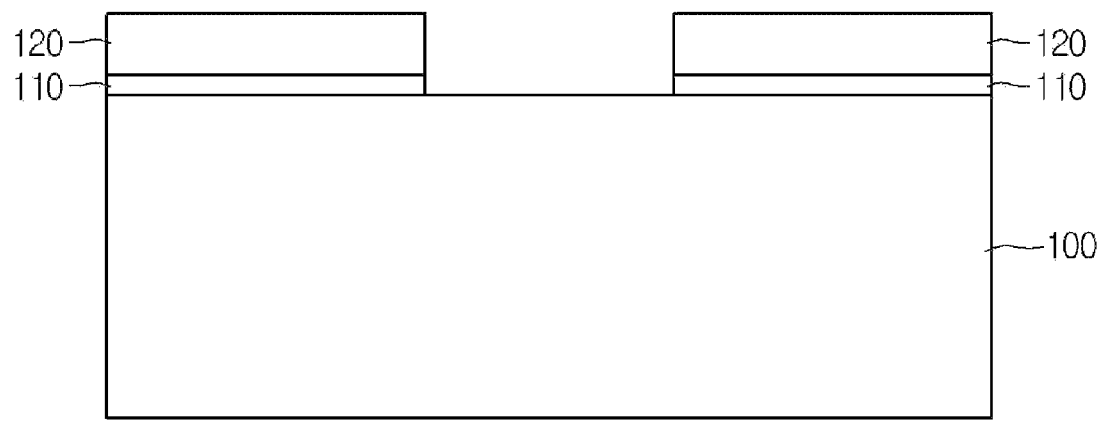
FIG. 2 is a cross-sectional view illustrating an exemplary semiconductor device after a nitride layer and an insulating layer are etched according to an embodiment of the invention.

FIG. 2 is a cross-sectional view illustrating an exemplary structure of a semiconductor device after a nitride layer and an insulating layer are etched according to an embodiment of the invention.

First, the nitride layer 110 is formed on a substrate 100, and the insulating layer 120 is formed on the nitride layer 110. Alternatively, the insulating layer 120 is formed on the substrate 100, and the nitride layer 110 is formed on the insulating layer 120. For example, the nitride layer 110 may comprise or consist essentially of silicon nitride (SiN), and the insulating layer 110/120 may comprise a silicon oxide (e.g., an oxide formed from decomposition of tetraethyl orthosilicate [TEOS], or $Si(OC_2H_5)_4$), using a low pressure-chemical vapor deposition (LP-CVD) method. The insulating layer 120 reduces stresses applied to the substrate 100 when the nitride layer 110 is formed or a post heat treatment process is performed.

The nitride and insulating layers 110/120 are used as a mask layer when a trench (C) is formed in a later process. Furthermore, the nitride layer 110 can be used as a polishing stop layer in a chemical-mechanical polishing process.

Then, a photoresist layer is formed on the nitride layer 110, and the photoresist layer is patterned by a photolithography process to form a photoresist pattern. At this time, an opening of the photoresist pattern is aligned with a region of the substrate 100 where a device isolation region will be formed. A first anisotropic dry etching process such as a reactive ion etching process is performed using the photoresist pattern as an etch mask so as to remove portions of the nitride layer 110 and the insulating layer 120.

As shown in FIG. 2, in a state where a region for a trench of a device isolation region is exposed, a second dry etch process is performed using the nitride layer 110 as an etch mask. The device isolation trench may have sidewalls formed at an angle of up to about 30° (e.g., from about 10° to about 20° with respect to a vertical axis).

Figure 3:
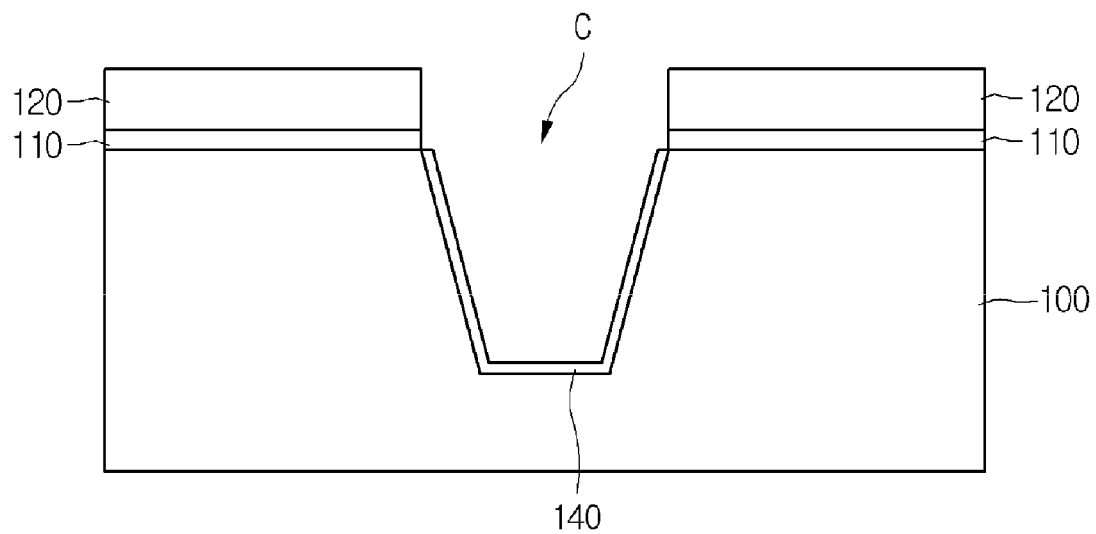
FIG. 3 is a cross-sectional view illustrating an exemplary structure of the semiconductor device after a buffer layer is formed on etched surfaces of a trench (C) according to an embodiment of the invention.

FIG. 3 is a cross-sectional view illustrating an exemplary structure of the semiconductor device after a buffer layer 140 is formed on etched surfaces of a trench (C) according to an embodiment of the invention.

As a result of the second dry etch process, the trench (C) is formed in the device isolation region of the substrate 100 which is exposed through openings of the nitride layer 110 and the insulating layer 120.

Next, a thermal oxidation process is performed at a temperature of about 800° C. to about 900° C. so as to form the buffer layer 140 on the exposed surface of the trench (e.g., the surface of the substrate 100 including the trench (C)) as shown in FIG. 3. The buffer layer 140 may repair or amend damage to and/or defects in the lattice of the substrate 100, and particularly, to the surface of the trench (C). Furthermore, in a later ion implant process, the buffer layer 140 may protect etched surfaces of the trench (C). Moreover, when an insulating layer is deposited in the trench (C), the insulating layer can easily adhere to the sidewall surfaces of the trench (C) owing to the buffer layer 140. The buffer layer 140 may have a thickness of about 15 nm to about 20 nm.

Figure 4:
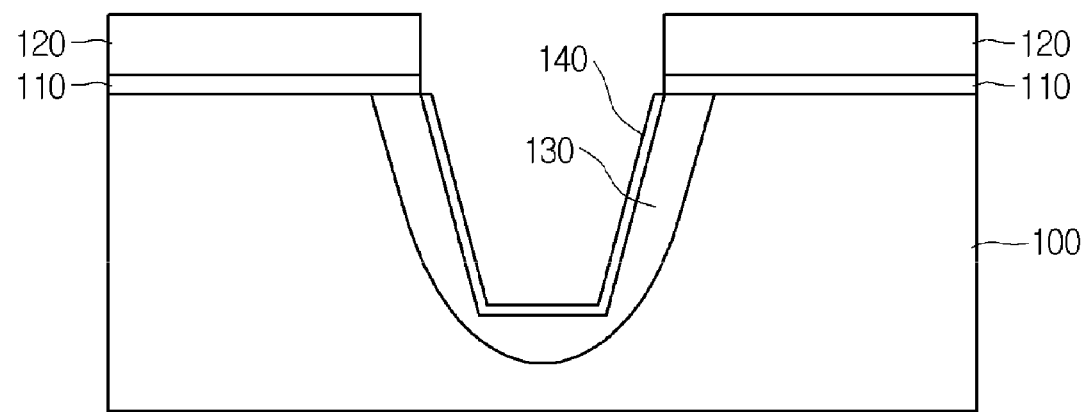
FIG. 4 is a cross-sectional view illustrating an exemplary structure of the semiconductor device after a stress-inducing ion layer is formed around the trench (C) according to an embodiment of the invention.

FIG. 4 is a cross-sectional view illustrating an exemplary structure of the semiconductor device after an ion layer 130 is formed around the trench (C) according to an embodiment of the invention.

The etched surfaces of the trench (C) are doped or otherwise implanted with an impurity using the patterned nitride and insulating layers 110/120 as an ion implant mask. In one embodiment, Ge ions may be used as the stress-inducing impurity, and the Ge ions may be implanted to a concentration of about $1\times10^{15}$ ions/cm$^2$ to about $5\times10^{15}$ ions/cm$^2$ at an energy of about 20 keV.

Through the above-described process, as shown in FIG. 4, the buffer layer 140 can have a depth of about 35 Å to about 45 Å. The stress-inducing ions may be implanted, for example, at an angle of about 30° to about 40°, so as to allow the stress-inducing layer 130 to have a large angle with respect to a horizontal and/or vertical surface of the substrate 100. The reason for this is to implant the stress-inducing impurity ions to a relatively uniform depth across the etched surfaces of the trench (C), although the etched surfaces of the trench (C) are inclined and the nitride layer 110 and the insulating layer 120 are adjacent to the trench (C).

In one embodiment, the buffer layer 140 is formed on the etched surfaces of the trench (C), and the stress-inducing layer 130 is formed in the substrate below and/or adjacent to (e.g., on the inside of the etched surfaces of) the trench (C). Alternatively, the stress-inducing layer 130 may be formed before the buffer layer 140, to possibly further repair damage to sidewalls of the trench as a result of implanting the ions for the stress-inducing layer 130. Therefore, although a leakage current may increase due to high-speed operations of active devices, the increased leakage current can be flexibly handled, and active regions can be isolated more stably.

Figure 5:
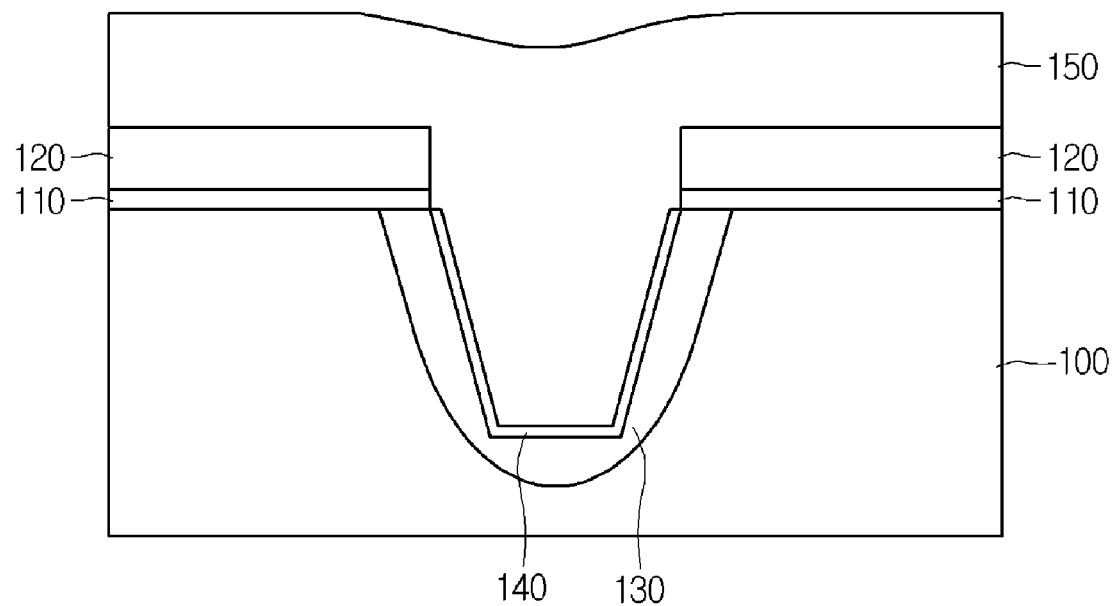
FIG. 5 is a cross-sectional view illustrating an exemplary structure of the semiconductor device after a trench insulating layer is formed according to an embodiment of the invention.

FIG. 5 is a cross-sectional view illustrating an exemplary structure of the semiconductor device after a trench insulating layer 150 is formed according to an embodiment of the invention.

Thereafter, processes such as an ozone-TEOS glass-forming process, an atmospheric CVD process, a plasma CVD process, and a high density plasma chemical vapor deposition process (HDP CVD) process may be (selectively) performed so as to form a trench insulating layer 150 on the nitride layer 110 and in the trench (C) to a sufficient thickness to fill the trench, as shown in FIG. 5.

Next, a chemical-mechanical polishing is performed to planarize the trench insulating layer 150 until the trench insulating layer 150 is flush (e.g., substantially coplanar) with the nitride layer 110. Here, the nitride layer 110 functions as a polishing stop layer.

After planarizing the trench insulating layer 150, a high-temperature heat treatment process is performed at a temperature of about 800° C. to about 1200° C. to densify the trench insulating layer 150. By this, the insulating and/or isolating characteristics of the trench insulating layer 150 can be improved.

Next, a series of wet etching processes are performed to remove the nitride layer 110, the insulating layer 120, and a portion of the trench insulating layer 150 located above the surface of the substrate 100. Therefore, a device isolation region is formed by filling the trench (C) with the trench insulating layer 150, then active regions of the substrate 100 at sides of the device isolation region 150 are exposed.

Figure 6:
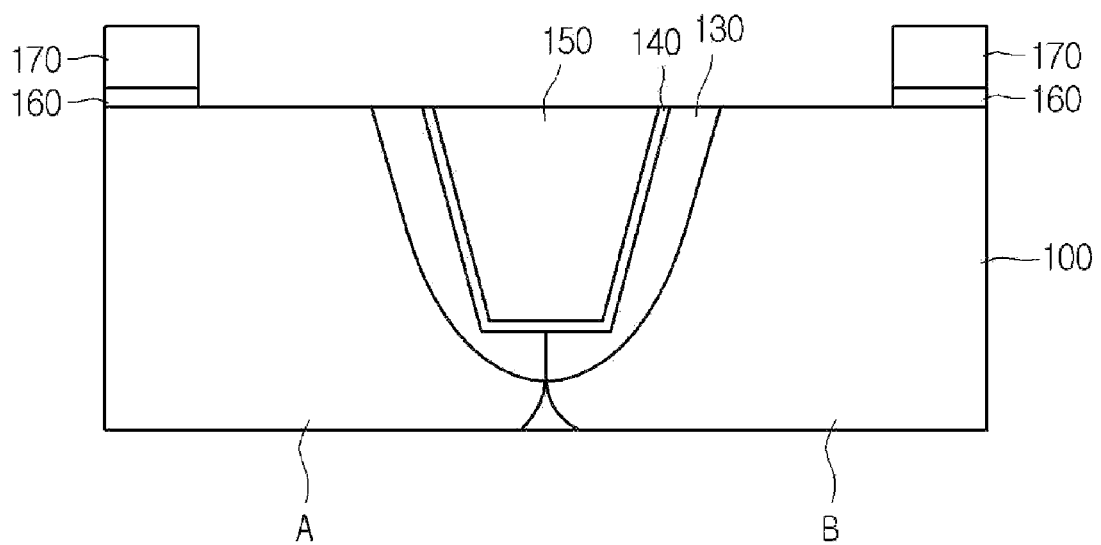
FIG. 6 is a cross-sectional view illustrating an exemplary structure of the semiconductor device after a gate electrode is formed according to an embodiment of the invention.

FIG. 6 is a cross-sectional view illustrating an exemplary structure of the semiconductor device after a gate electrode 170 is formed according to another embodiment of the invention.

After the device isolation region 150 is formed, well regions (A) and (B) are formed with respect to the trench insulating layer 150. That is, referring to FIG. 6, a P-well region (A) is formed on one side of the trench insulating layer 150, and an N-well region (B) is formed at an opposite side of the trench insulating layer 150. The P-well region (A) (an active region) functions as an NMOS transistor, and the N-well region (B) (an active region) functions as a PMOS transistor.

The P-well region (A) may be formed by forming a first photoresist pattern masking one active region and exposing the other active region of the substrate 100, and implanting impurity ions such as boron (B) ions into region (A) using the first photoresist pattern as a mask. The N-well region (B) may be formed by removing the first photoresist pattern, forming a second photoresist pattern exposing the previously masked active region and masking the previously exposed active region of the substrate 100, and implanting impurity ions such as phosphorous (P), arsenic (As) and/or antimony (Sb) ions using the second photoresist pattern as a mask. Naturally, the P-well region (A) and the N-well region (B) may be formed in the opposite sequence.

Thereafter, organic materials and contaminants remaining on the substrate 100 are removed using a chemical containing ammonium hydroxide (e.g., dilute aqueous $NH_4OH$) and an HCl containing chemical (e.g., dilute aqueous HCl), and an annealing process is performed to diffuse the impurity ions implanted in the active regions. In this way, the P-well region (A) and the N-well region (B) are formed as shown in FIG. 6.

The annealing process may be a spike annealing process. Through such an annealing process, super-steep retrograde (SSR) wells can be formed. During the annealing process, the ion layer is also annealed along with the P-well region (A) and the N-well region (B) so that the Ge ions implanted in the ion layer can be activated. That is, according to one embodiment, an additional heat treatment process is not necessary for diffusing the ions implanted in the stress-inducing layer 130.

After forming the P-well region (A) and the N-well region (B), a thin gate oxide layer 160 is formed on the entire (exposed silicon) surface of the substrate 100, and a relatively thick polysilicon layer 170 is formed on the gate oxide layer 160. After the polysilicon layer 170 is formed, a photoresist pattern is formed on the polysilicon layer 170, and an etch process is performed, in order to etch the gate oxide layer 160 and the polysilicon layer 170 and expose the device isolation region 150, the buffer layer 140, the ion layer 130, and the active regions (A) and (B). The gate oxide layer 160 functions as a gate insulating layer, and the polysilicon layer 170 functions as a gate electrode.

Figure 7:
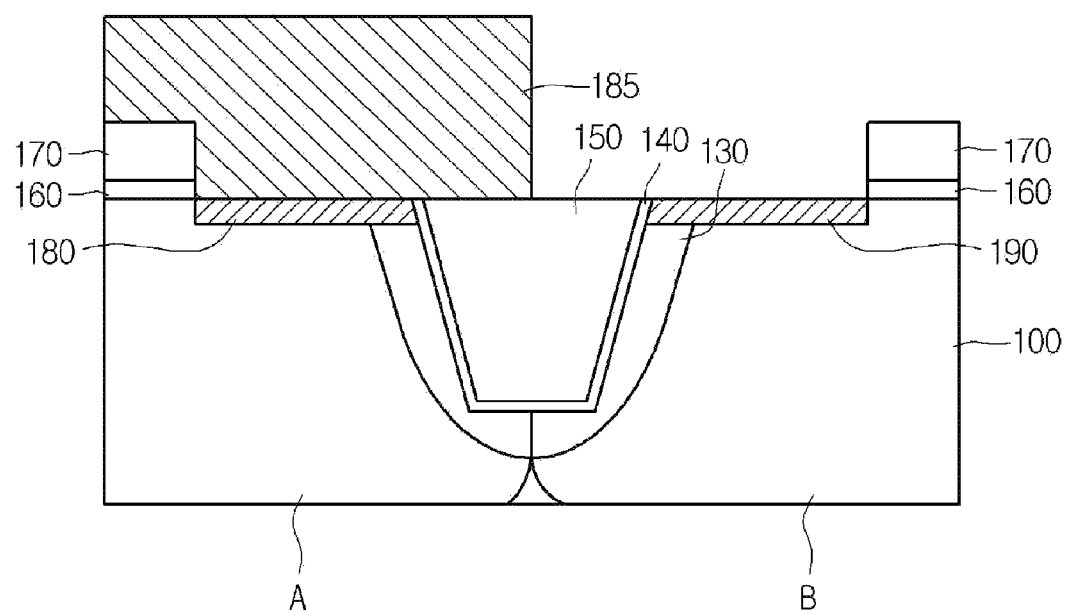
FIG. 7 is a cross-sectional view illustrating an exemplary structure of the semiconductor device after a photoresist pattern is formed to implant ions in a PMOS LDD region according to an embodiment of the invention.

FIG. 7 is a cross-sectional view illustrating an exemplary structure of the semiconductor device after a photoresist pattern 185 is formed to implant stress-inducing ions in a PMOS LDD region 190 according to yet another embodiment of the invention.

After photoresist pattern 185 is formed, impurity ions such as $BF_2$ ions are implanted into the exposed active region of the substrate 100 to a concentration of about $1 \times 10^{14}$ ions/cm$^2$ to about $5 \times 10^{15}$ ions/cm$^2$ at an implant energy of about 5 KeV to about 50 KeV using the gate electrode 170 as an ion implanting mask so as to form LDD region 190. At this time, the photoresist pattern 185 is formed to cover the NMOS transistor region (i.e., the P-well region (A)) and at least a portion of the device isolation region 150. Before or after photoresist pattern 185 is formed, a similar (but complementary) photoresist pattern is formed to cover the PMOS transistor region (i.e., the N-well region (B)) and at least a portion of the device isolation region 150, then impurity ions (such as P, As and/or Sb ions) are implanted into the active regions of the substrate 100 to a similar concentration (e.g., about $1 \times 10^{14}$ ions/cm$^2$ to about $5 \times 10^{15}$ ions/cm$^2$) and at a similar implant energy (e.g., about 5 KeV to about 50 KeV) using the gate electrode 170 as an ion implanting mask so as to form LDD region 180.

The photoresist pattern 185 is also formed to implant additional stress-inducing impurity ions into the PMOS LDD region so that the NMOS region can have a strained Si structure with a predetermined tensile stress level. Furthermore, a compressive stress can be locally increased in a PMOS channel region by this technique. The additional impurity ions implanted into the PMOS LDD region 190 may be functionally equivalent to but larger than silicon, such as Ge ions, Sn ions, a combination of Ga and As ions, etc.

As explained above, stress-inducing (e.g., Ge) ions are implanted into the PMOS region using the photoresist pattern so that hole mobility in the PMOS channel region and electron mobility in a NMOS channel region can be increased. Therefore, transistor operating currents can be improved by 15% or more. In these processes, a semiconductor device such as the semiconductor device of FIG. 1 is manufactured.

Thereafter, a series of post processes such as processes for forming a sidewall spacer, source and drain regions, a silicide layer, a contact forming process, and a metal line forming process may be further performed.

According to embodiments of the invention, the following effects can be attained.

First, isolation and/or insulation between active regions of a semiconductor device may be improved so that current leakage in active devices can be minimized, and thus the integration level of a device can be increased. Particularly, the operating characteristics of a cell array type highly-integrated semiconductor memory device can be improved.

Secondly, electron mobility is increased by increasing the tensile stress of the NMOS region, and hole mobility is increased by increasing the compressive stress of the PMOS region, so that operating currents can be increased, and the semiconductor device can be operated at high speed.

Thirdly, according to embodiments of the invention, the operating characteristics of the semiconductor device can be improved by controlling the stress of the substrate through simple and inexpensive processes, as compared to the case of controlling the stress of the substrate using related-art processes such as a high-temperature heat treatment using heavy metal ions such as Sb/In ions, a method of self-growing heavy metal in or on a trench, and an insulating film inserting method.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
   a substrate comprising a device isolation region;
   a stress-inducing layer in a PMOS region and an NMOS region of the substrate adjacent to the device isolation region;
   a P-well in the NMOS region and an N-well in the PMOS region of the substrate at least partially separated by the device isolation region;
   a gate electrode on the substrate away from the device isolation region; and
   lightly doped drain (LDD) regions in the NMOS and PMOS regions of the substrate, defined by the device isolation region and the gate electrode, wherein the lightly doped drain region in the PMOS region further comprises a stress-inducing ion implant region.

2. The semiconductor device according to claim 1, wherein the stress-inducing layer and the stress-inducing ion implant region in the comprise Ge ions, Ga and As ions, Sn ions, or combinations thereof.

3. The semiconductor device according to claim 1, further comprising a buffer oxide layer between the device isolation region and the substrate.

4. The semiconductor device according to claim 1, further comprising a gate insulating layer between the gate electrode and the substrate.

5. The semiconductor device according to claim 1, further comprising:
   a spacer at sides of the gate electrode;
   a source region and a drain region in the lightly doped drain regions at sides of the gate electrode; and
   a silicide layer on the gate electrode, the source region, and the drain region.

6. The semiconductor device according to claim 1, wherein the lightly doped drain region in the PMOS region is a p type lightly doped drain region, and the lightly doped drain region in the NMOS region is an n-type lightly doped drain region.

7. The semiconductor device according to claim 3, wherein the buffer oxide layer has a thickness of about 15 nm to about 20 nm.

8. The semiconductor device according to claim 1, wherein the stress- inducing layer has a depth of about 35Å to about 45Å from a surface of a trench in the substrate containing the device isolation layer.

9. A method for manufacturing a semiconductor device, the method comprising:
   etching an exposed area of a substrate using patterned nitride and insulating layers as an etch mask so as to form a trench in a substrate;
   forming a buffer layer on a surface of the trench;
   forming a stress-inducing layer by implanting ions into a region of the substrate around the trench using the patterned nitride and insulating layers as an ion implant mask;
   forming a device isolation region by filling the trench with an trench insulating layer; removing the patterned nitride and insulating layers;
   forming a lightly doped drain region in an active region defined by the device isolation region; and
   implanting ions into the lightly doped drain region to form a stress-inducing region in the lightly doped drain region.

10. The method according to claim 9, wherein the nitride layer comprises SiN, and the insulating layer comprises a tetraethyl orthosilicate (TEOS)-based oxide.

11. The method according to claim 9, wherein forming the patterned nitride and insulating layers comprises forming a nitride layer and an insulating layer using a low-pressure chemical vapor deposition (LP-CVD) method, then patterning the nitride layer and the insulating layer to form the patterned nitride and insulating layers.

12. The method according to claim 9, wherein the buffer layer comprises an oxide layer having a thickness of about 15 nm to about 20 nm.

13. The method according to claim 9, wherein forming the buffer layer comprises thermally oxidizing an exposed surface of the trench at a temperature of about 800° C. to about 1200° C.

14. The method according to claim 9, wherein forming the stress-inducing layer comprises implanting Ge ions at a concentration of about $1 \times 10^{15}$ to about $5 \times 10^{15}$ ions/cm$^2$ at an energy of about 20 KeV.

15. The method according to claim 9, wherein forming the stress-inducing layer comprises implanting the ions at an angle of about 30° to about 40° with respect to a surface of the substrate.

16. The method according to claim 9, wherein the stress-inducing layer has a depth of about 35 Å to about 45 Å from the surface of the trench.

17. The method according to claim 9, further comprising:
   forming a P-well at a side of the device isolation region and an N-well at an opposite side of the device isolation region by selective ion implantation;
   annealing a the substrate comprising the P-well, the N-well, and the stress-inducing layer; and
   forming a gate insulating layer and a gate electrode.

18. The method according to claim 17, wherein forming the stress-inducing region comprises:
   forming a photoresist pattern over of the substrate to cover the P-well and at least a portion of the device isolation region; and
   implanting stress-inducing impurity ions into the lightly doped drain region in the N-well using the photoresist pattern as an ion implantation mask.

19. The method according to claim 18, wherein the stress-inducing ions comprise Ge ions, Ga and As ions, Sn ions, or combinations thereof.

20. The method of claim 17, wherein annealing the substrate comprises spike annealing.

* * * * *